United States Patent
Li et al.

(10) Patent No.: US 11,127,706 B2
(45) Date of Patent: Sep. 21, 2021

(54) ELECTRONIC PACKAGE WITH STUD BUMP ELECTRICAL CONNECTIONS

(71) Applicant: Intel Corporation, Santa Clara, CA (US)

(72) Inventors: Zhaozhi Li, Chandler, AZ (US); Sanka Ganesan, Chandler, AZ (US); Debendra Mallik, Chandler, AZ (US); Gregory Perry, Santa Clara, CA (US); Kuan H. Lu, Chandler, AZ (US); Omkar Karhade, Chandler, AZ (US); Shawna M. Liff, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,999

(22) Filed: Sep. 28, 2018

(65) Prior Publication Data
US 2020/0105701 A1    Apr. 2, 2020

(51) Int. Cl.
*H01L 23/00* (2006.01)

(52) U.S. Cl.
CPC .............. *H01L 24/17* (2013.01); *H01L 24/09* (2013.01); *H01L 24/11* (2013.01); *H01L 24/81* (2013.01); *H01L 24/06* (2013.01); *H01L 24/97* (2013.01); *H01L 2924/01029* (2013.01); *H01L 2924/01047* (2013.01); *H01L 2924/01079* (2013.01)

(58) Field of Classification Search
CPC ......... H01L 24/17; H01L 24/81; H01L 24/09; H01L 24/11; H01L 2924/01079; H01L 2924/01047; H01L 2924/01029; H01L 24/06; H01L 24/97
See application file for complete search history.

(56) References Cited

U.S. PATENT DOCUMENTS

| 5,998,861 A | * | 12/1999 | Hiruta | H01L 21/563 257/700 |
| 2006/0170112 A1 | * | 8/2006 | Tanaka | H01L 24/81 257/777 |
| 2008/0315436 A1 | * | 12/2008 | Mueller | H01L 24/06 257/778 |
| 2016/0219721 A1 | * | 7/2016 | Sakai | H01L 23/49811 |

\* cited by examiner

*Primary Examiner* — Patricia D Reddington
(74) *Attorney, Agent, or Firm* — Schwegman Lundberg & Woessner, P.A.

(57) ABSTRACT

An electronic package and method includes a substrate including a plurality of pads on a major surface. An electronic component including a plurality of pads on a major surface facing the major surface of the substrate. A stud bump electrically couples one of the plurality of pads of the substrate to one of the plurality of pads of the electronic component.

12 Claims, 10 Drawing Sheets

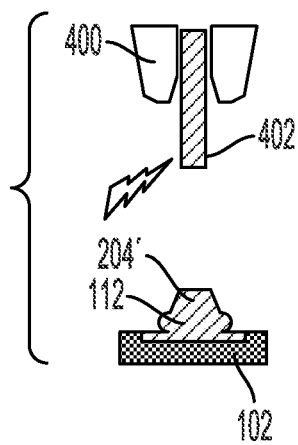 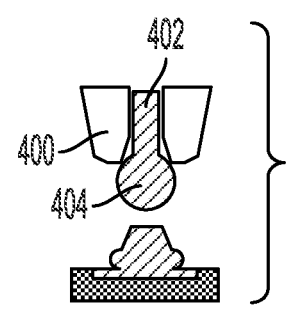
FIG. 4F        FIG. 4G
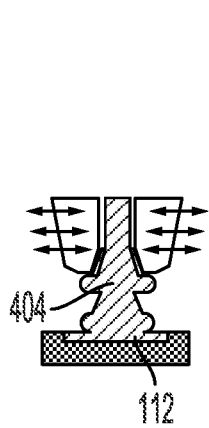 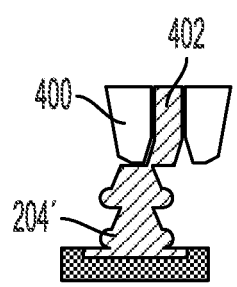 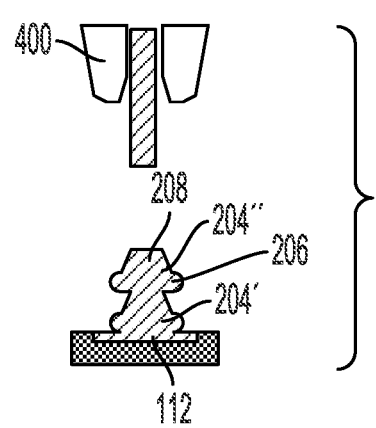
FIG. 4H        FIG. 4I        FIG. 4J

ELECTRONIC PACKAGE WITH STUD BUMP ELECTRICAL CONNECTIONS

TECHNICAL FIELD

The disclosure herein relates generally to an electronic package with stud bump electrical connections.

BACKGROUND ART

Electronic assemblies, such as electronic chips, can include various electronic components electrically coupled to one another. For instance, a package may include a system on a chip and a memory chip all electrically coupled to a package substrate. Various techniques, such as wirebonding, have been used for the electrical connections.

BRIEF DESCRIPTION OF THE DRAWINGS

FIGS. 4A-4J illustrate a process for making stud bumps and stud bump stacks, in various examples.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Wirebonding has, in certain circumstances, given way to other techniques to allow for so-called flip chip designs. In contrast to conventional techniques, in which the pads on chips in the package all or mostly are oriented in the same "up" direction, techniques of electrically coupling the pads of various chips allow the pads to generally face one another with a connection proceeding directly between the two sets of pads. The connection paths are thus more direct than with conventional wirebonding techniques, providing for shorter and more robust connections.

However, such flip chip techniques have downsides, including in the manufacture process. While wirebonding may provide simply for connecting one pad to another with a flexible wire, various flip chip techniques involve processes such as drilling into a package material, masking the placement of material, or otherwise adding a relatively significant number of additional steps to the process. Moreover, various flip chip designs may reduce manufacturing yield, further increasing costs.

An electronic package with flip chip design has been developed that utilizes stud bumps to provide electrical connection between pads. The stud bumps may be individual stud bumps coupling a first pad to a second pad or may be stacked to extend between the pads. To create stacks, the stud bumps are sequentially placed stacked on top of one another from a first pad until a gap to a second pad is closed and the first and second pads are electrically coupled to one another. The stud bumps may be relatively simple to manufacture and provide further flexibility in the materials used in the stud bumps. As various materials may bond better with materials used on the pads, different material may be used in each stud bump to better promote bonding, potentially improving both the electrical connection and manufacturing yield.

Figure 1:
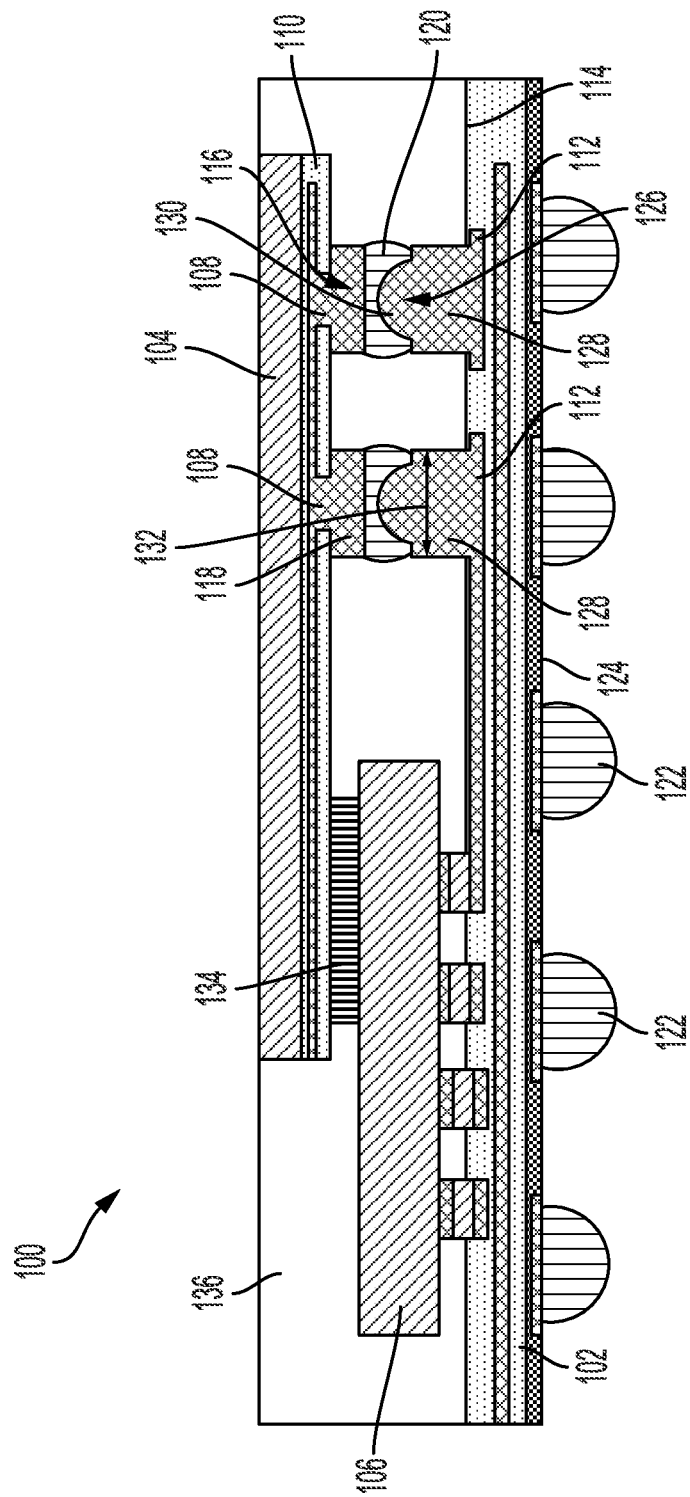
FIG. 1 is a side view of an electronic package, in an example embodiment.

FIG. 1 is a side view of an electronic package 100, in an example embodiment. The electronic package 100 includes a substrate 102, a first chip 104, and a second chip 106. In an illustrative example, the first chip 104 is a memory chip and the second chip 106 is a system on a chip, though it is emphasized that that is for illustrative purposes and that any chip or any other device or object including active or passive pads may be utilized instead of one or both of the first and second chips 104, 106. Moreover, while two chips 104, 106 are illustrated, examples with only the first chip 104 and not the second chip 106 are contemplated. Similarly, examples with more than two chips 104, 106 are contemplated, and the principles described with respect to the first and second chips 104, 106 may readily be extended to additional chips or other devices or objects that include active or passive pads.

The first chip 104 includes a plurality of pads 108 on a major surface 110 of the first chip 104. The first chip 104 is in a flip chip orientation and the plurality of pads 108 of the first chip face the plurality of pads 112 on a major surface 114 of the substrate 102. In the illustrated example, each of the plurality of pads 108 of the first chip 104 include or are coupled to a starter 116 formed of a copper component 118 and a solder component 120, though in alternative examples the starter 114 is formed of any of a variety of suitable materials. The substrate 102 further includes a plurality of output solder bumps 122 on a second major surface 124 opposite the major surface 114 of the substrate 102 to provide input and output to the electronic package 100 as a whole.

Each of the plurality of pads 108 of the first chip 104 are coupled to an associated one of the plurality of pads 112 of the substrate using a stud bump 126. The stud bump 126 conventionally includes a base segment 128 and a dome segment 130. As illustrated, the base segment 128 is directly coupled to the pad 112 of the substrate 102 and the dome segment 130 is directly coupled to the starter 116 of the pad 108 of the first chip 104. While the dome segment 130 is of a consistent size, the base segment 128 may be made as long as is necessary to cause the stud bump 126 to extent between and electrically couple the pads 108, 112. In various examples, the stud bumps 126 are comprised of copper, though it is to be recognized and understood that a variety of different materials may be utilized as desired, including gold and silver. In an illustrative example, the stud bumps 126 each have a diameter 132 of approximately thirty (30) micrometers across their base segments 128, though it is to be recognized and understood that any suitable diameter 132 may be implemented dependent on the characteristics of the pads 108, 112 and the electronic package 100 as a whole.

The electronic package 100 is completed with the inclusion of a spacer 134, such as an epoxy or any other suitable material, and an insulator 136. The spacer 134 and the insulator 136 may function to provide structural support for the electronic package 100 generally and electrical isolation for the various components of the electronic package 100. The spacer 134 and insulator 136 may be applied according to any suitable technique.

While the stud bumps 126 are illustrated with a relatively tall base segment 128 and a relatively short dome segment 130 (or an ordinary dome segment 126 in comparison to other dome segments illustrated herein), it is to be recognized and understood that the relatively proportions of the dome segment 130 and the base segment 128 may be different in various examples. Thus, for instance, the dome segment 130 may be relatively long while the base segment 128 may be short or otherwise an ordinary base segment 128 relative to other base segments disclosed herein. Further, for instance, both the base segment 128 and the dome segment 130 may be of intermediate height, e.g., the base segment 128 and dome segment 130 may each be the same height.

Figure 2:
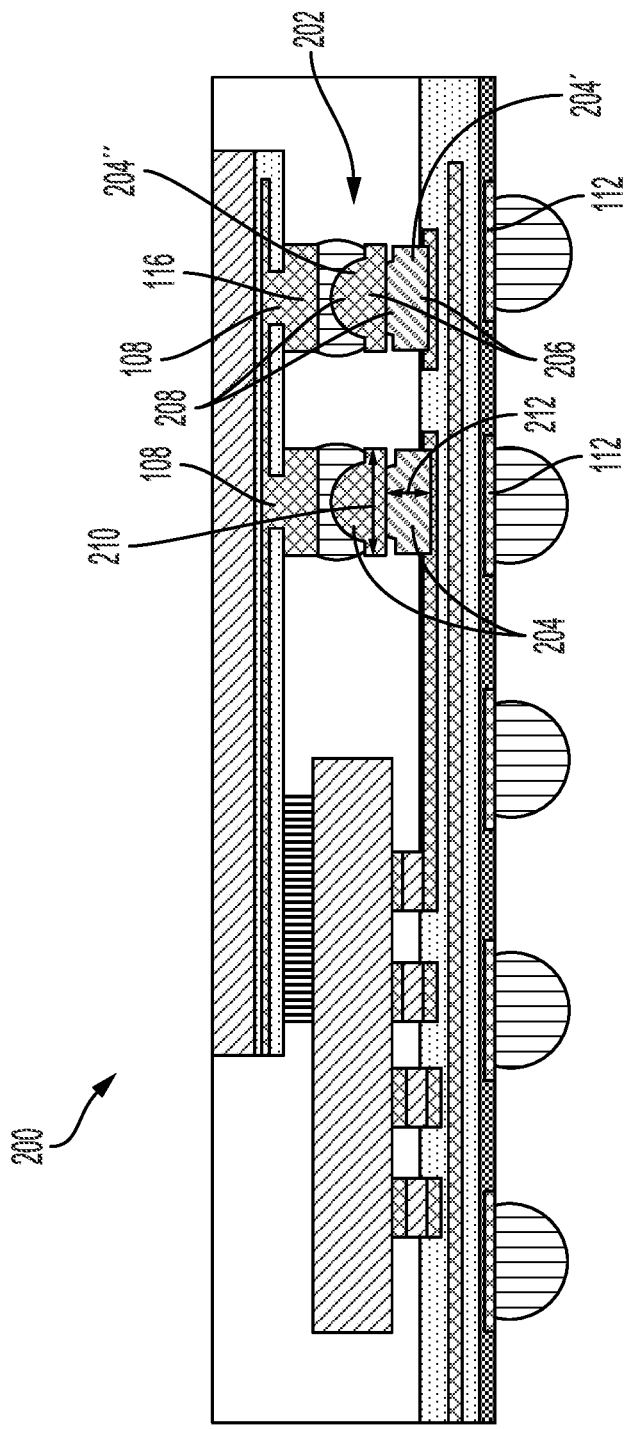
FIG. 2 is an example of an electronic package including stud bump stacks, in an example embodiment.

FIG. 2 is an example of an electronic package 200 including stud bump stacks 202, in an example embodiment. The architecture of the electronic package 100 may otherwise be the same as that of the electronic package 100, except that rather than a single stud bump 126 extending between the pads 108, 112, a plurality of stud bumps 204 are stacked on top of one another to electrically couple the pads 108, 112 to one another. In a particular stud bump stack 202, a first stud bump 204' has a base segment 206 coupled to the pad 112 and a dome segment 208 coupled to the base segment 206 of the second stud bump 204". The dome segment 208 of the second stud bump 204" is coupled to the starter 116 of the pad 108.

While the stud bump stacks 202 are illustrated each with two individual stud bumps 204, it is to be recognized and understood that any number of stud bumps 204 may be utilized in a stack 202 to make the stack 202 connect between the pads 108, 112. In an illustrative example, the stud bumps 204 each have a diameter 210 of approximately thirty (30) micrometers and a height 212 of between fifteen (15) and thirty (30) micrometers, i.e., between one-half the diameter 210 and the diameter 210 itself. This stands in contrast to the stud bump 126, which has a height clearly greater than the diameter 132.

In various examples, the stud bumps 204 may all be made of the same conductive material or different conductive material. For instance, in one example the stud bumps 204 are all made of copper or otherwise made of the same conductive material. In an alternative example, the stud bumps 204' are made of gold while the stud bumps 204" are made of copper. In another alternative example, the stud bumps 204' are made of silver while the stud bumps 204" are made of copper. The conductive material may also be switched between the stud bumps 204, i.e., the stud bump 204' may be copper and the stud bump 204" may be gold, etc. Moreover, it is to be recognized and understood that any suitable metal, alloy, or compound may be utilized as desired.

The conductive material of the stud bumps 204 may be selected based on the characteristics of the pads 108, 112, to which the stud bumps 204 are coupled. For instance, gold may be easier to bond to the pads 112 of the substrate, and thus be utilized in the stud bump 204', while copper may be easier to bond to the starter 116, and thus be utilized in the stud bump 204". Where additional stud bumps 204 are included in a stack 202, e.g., between the stud bumps 204' and 204", the additional stud bumps 204 may similarly be any suitable conductive material.

Figure 3A:
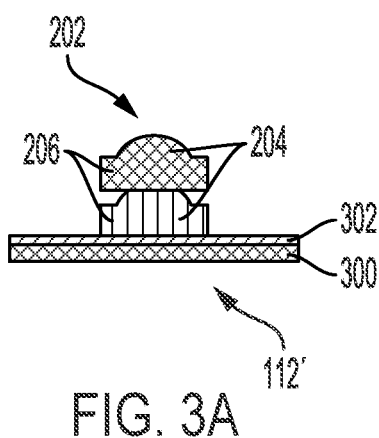
FIGS. 3A and 3B are detailed illustrations of stud bump stacks in relation to a pad, in an example embodiment.
Figure 3B:
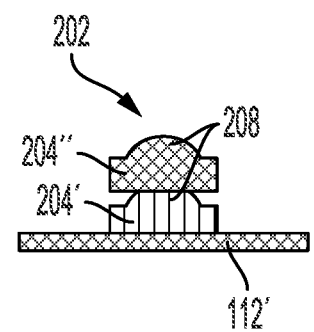

FIGS. 3A and 3B are detailed illustrations of stud bump stacks 202 in relation to a pad 112, in an example embodiment. As illustrated in FIG. 2, the stud bump stacks 202 each include two stud bumps 204. Each stud bump 204 has a base segment 206 and a dome segment 208. It is noted that the dome segment 208 of the stud bump 204' is flattened somewhat by the base segment 206 of the stud bump 204".

The pad 112 differs between FIGS. 3A and 3B in that while the pad 112" of FIG. 3B is a copper pad, the pad 112' of FIG. 3A has a copper pad 300 and a surface finishing 302. In various examples, the surface finishing 302 is any of a variety of suitable surface finishings, such as nickel-palladium-gold (NiPdAu) alloy or nickel-gold (NiAu) alloy. In various examples, the surface-finished pad 112' may more readily bond with a gold stud bump 204' while the pad 112" may more readily bond with a copper stud bump 204'.

FIGS. 4A-4J illustrate a process for making stud bumps 126, 204 and stud bump stacks 202, in various examples. It is to be recognized that process illustrated in FIGS. 4A-4E may be utilized to make an individual stud bump 126 while the addition of FIGS. 4F-4J are incorporated to make a stud bump stack 202. Moreover, the process of FIGS. 4F-4J may be iteratively repeated to add additional stud bumps 204 to the stack 202.

Figure 4A:
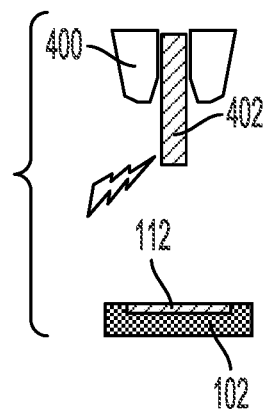
Figure 4B:
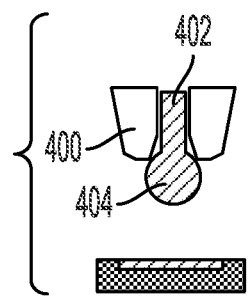
Figure 4C:
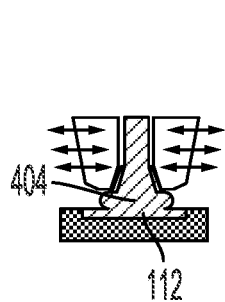
Figure 4D:
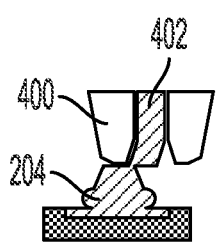
Figure 4E:
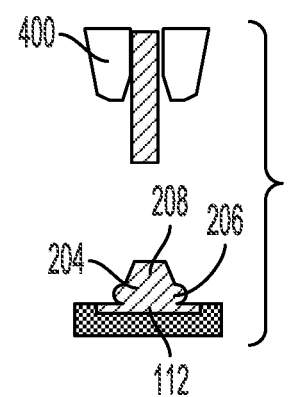

In FIG. 4A, a conventional extruder 400 useful for wirebonding processes is filled with conductive material 402 and positioned in proximity of the pad 112 of the substrate 102. The extruder 400 is subjected to energy input to cause the conductive material 402 to form a bulb 404, as shown in FIG. 4B. In FIG. 4C, the bulb 404 is bonded to the pad 112. In FIG. 4D, the extruder 400 is maneuvered to break the unused conductive material 402 from the formed stud bump 204 from. In FIG. 4E, the extruder 400 is removed, leaving behind the stud bump 204 having a base segment 206 and a dome segment 208 and bonded at the base segment 206 to the pad 112.

In FIG. 4F-4J, the process of FIGS. 4A-4E is repeated, respectively, only with the new stud bump 204" being bonded to the previously formed stud bump 204' to form the stud bump stack 202. It is noted that the conductive material 402 may change from the sequence of FIGS. 4A-4E to FIG. 4F-4J according to the principles disclosed herein.

Figure 5:
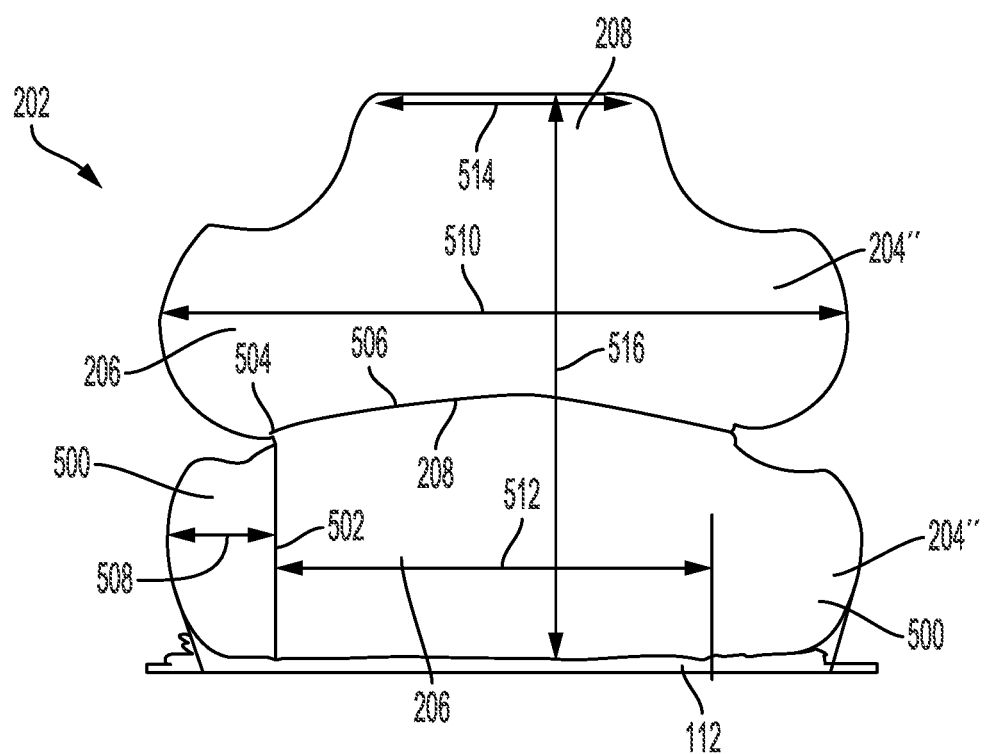
FIG. 5 is a detailed illustration of a stud bump stack, in an example embodiment.

FIG. 5 is a detailed illustration of a stud bump stack 202, in an example embodiment. The stud bump stack 202 includes the stud bumps 204. The base segment 206 of each of the stud bumps 204 is clearly visible and substantially unaltered by the stacking process illustrated in FIGS. 4A-4J. However, the dome segment 208 of the stud bump 204' is significantly flattened in relation to the dome segment 208 of the stud bump 204".

The following dimensions are provided by way of illustration of one example implementation of the stud bump stack 202 and is not limiting on any particular implementation consistent with principles disclosed herein. Wings 500 of the stud bumps 204 may generally be defined as a portion extending from a vertical line 502 extending from an extremity 504 of a junction 506 between the stud bumps 208. In an example, each of the wings 500 may have a width 508 of approximately thirteen (13) micrometers. The stud bump 208 may have a maximum width 510 of approximately fifty (50) micrometers, giving a junction width 512 of approximately twenty-four (24) micrometers. A minimum width 514 of the dome segment 208 may be approximately twenty (20) micrometers and the stud bump stack 202 may have a height 516 of approximately sixty (60) micrometers.

The illustration of FIG. 5 further serves to illustrate that the wirebonding of the stud bump 402 may cause the pad 112 to distort and bond to the stud bump 204.

Figure 6:
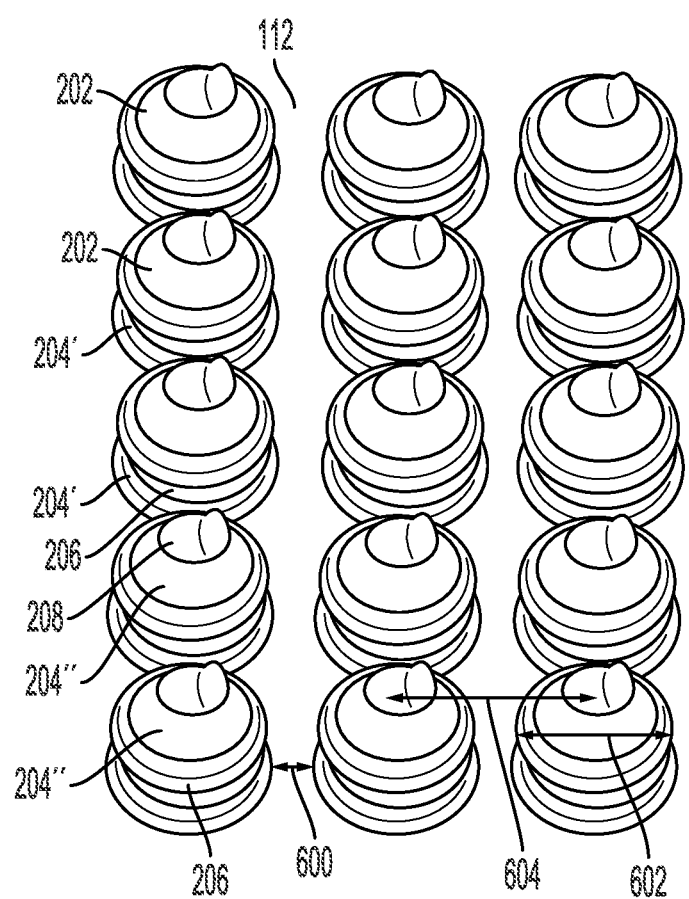
FIG. 6 is a top perspective illustration of multiple stud bump stacks, in an example embodiment.

FIG. 6 is a top perspective illustration of multiple stud bump stacks 202, in an example embodiment. The stud bump stacks 202 have been formed on the pads 112 (obscured) of the substrate 102 but before the pads 108 of the first chip 104 have been applied (not pictured). For the stud bumps 204', the base segment 206 is visible while the dome segment 208 is obscured. For the stud bumps 204", the base segment 206 and the dome segment 208 are both visible.

The perspective view of FIG. 6 further serves to illustrate an example in which the stud bumps 126, 204 are circular. Moreover, the depictions of FIGS. 1-5 are side images and that the stud bumps 204 and stud bump stacks 202 may extend into a depth of the images as well as across the images. In an illustrative example, the stud bump stacks 202 are separated by a lateral distance 600 of approximately fourteen (14) micrometers, have a diameter 602 of approximately fifty (50) micrometers, as in the example of FIG. 5, and, as a result, have a center-to-center distance 604 of approximately sixty-four (64) micrometers.

Figure 7:
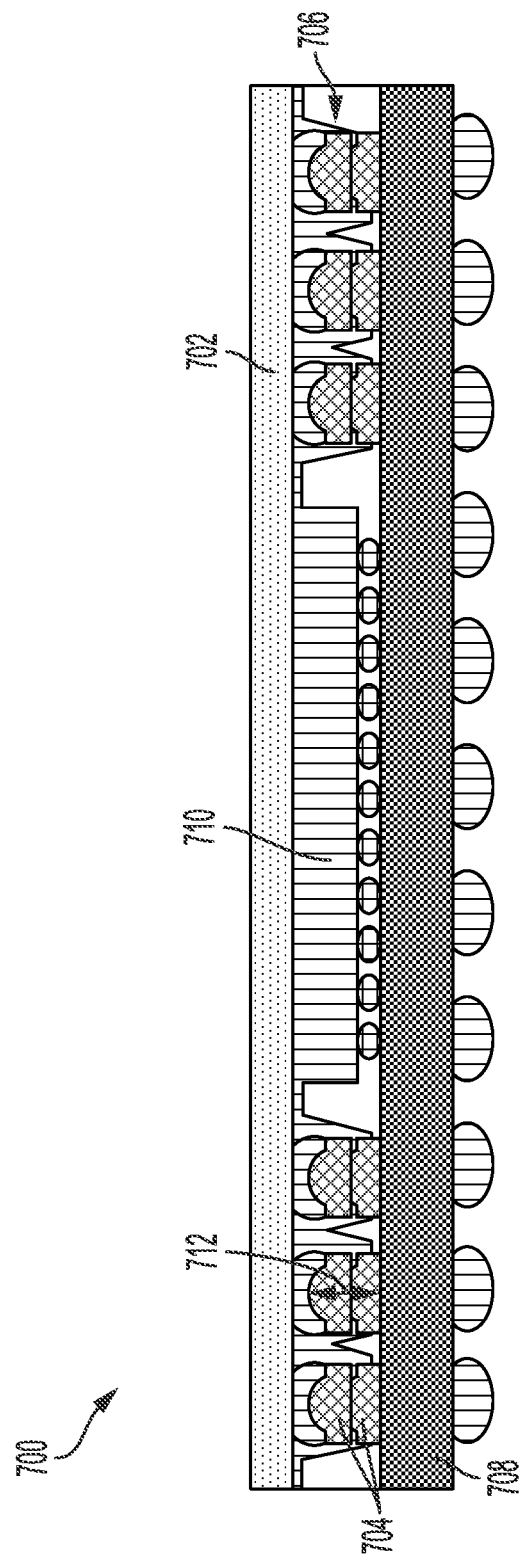
FIG. 7 is a side illustration of an electronic package, in an example embodiment.

FIG. 7 is a side illustration of an electronic package 700, in an example embodiment. While the electronic packages 100, 200 were described with respect to an active electronic component 104 having active pads 108, it is to be recognized and understood that an electronic component 702 that is not itself an active component, e.g., an interposer board, may be utilized with stud bumps 704 and stud bump stacks 706 according to the same principles disclosed described herein. While the electronic package 700 is illustrated with stud bump stacks 706, it is further to be recognized that single stud bumps 704 may be utilized according to the principles of the stud bumps 126 of FIG. 1.

The electronic package includes the passive electronic component 702 coupled via the stud bump stacks 706 to a substrate 708. A second electronic component 710, e.g., a system on a chip, is positioned between the passive electronic component 702 and the substrate 708, resulting in a potential need for the stud bump stacks 706 to be of a height 712 sufficient to provide clearance for the second electronic component 710.

Figure 8:
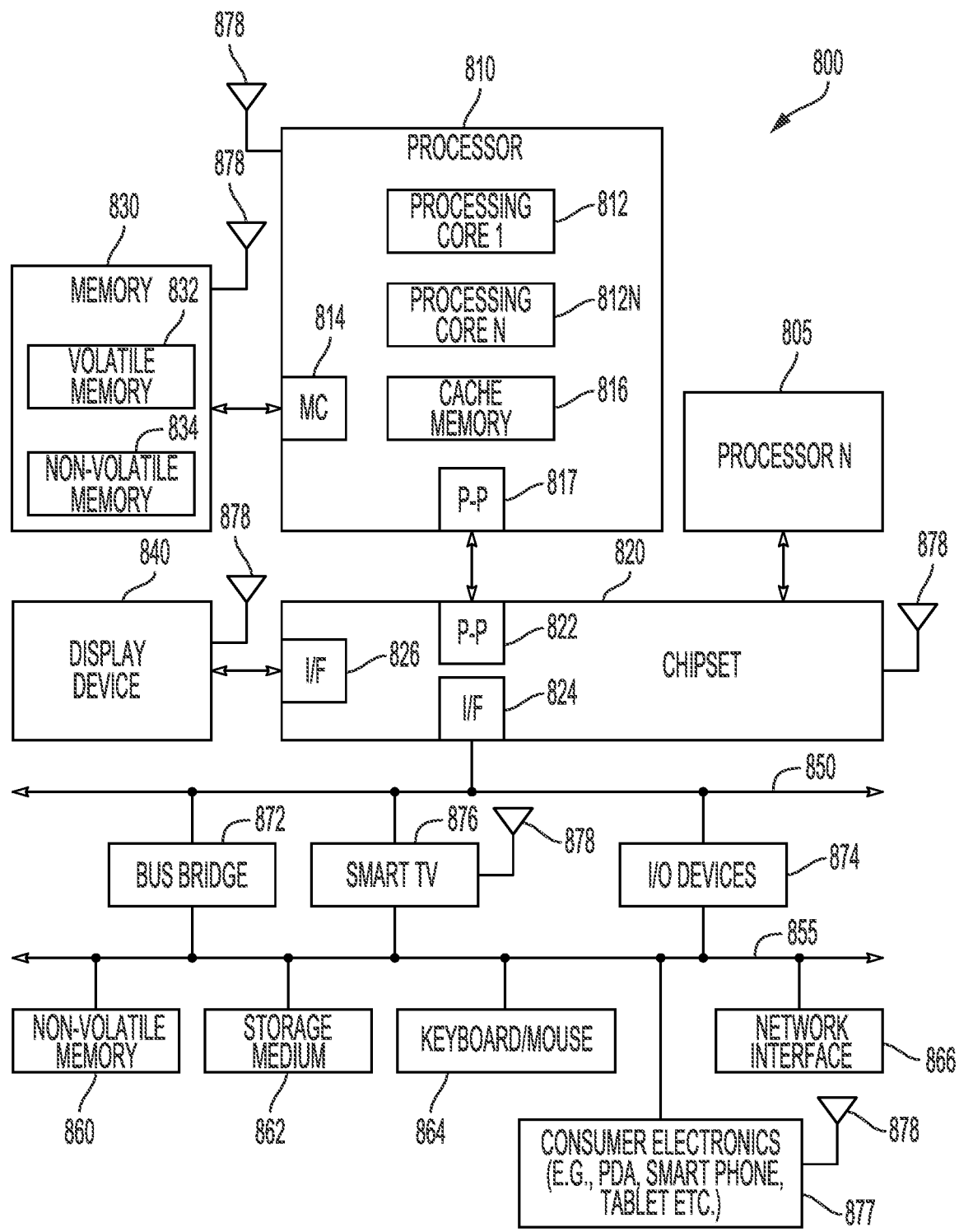
FIG. 8 illustrates a system level diagram, depicting an example of an electronic device (e.g., system) including an electronic chip, in an example embodiment.

FIG. 8 illustrates a system level diagram, depicting an example of an electronic device (e.g., system) including any of the electronic packages 100, 200, 700, in an example embodiment. FIG. 8 is included to show an example of a higher-level device application for the electronic packages 100, 200, 700. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices), a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of wellknown network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

Figure 9:
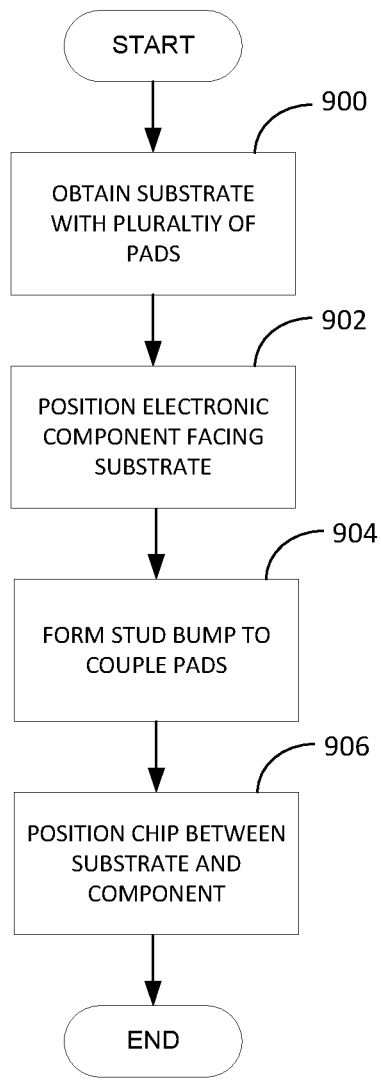
FIG. 9 is a flowchart for making an electronic package, in an example embodiment.

FIG. 9 is a flowchart for making an electronic assembly, in an example embodiment. The electronic assembly may be any of the electronic packages 100, 200, 700, or any other suitable electronic assembly.

At 900, a substrate including a plurality of pads on a major surface is obtained.

At 902, an electronic component is including a plurality of pads on a major surface is positioned facing the major surface of the substrate.

At 904, a stud bump is formed to electrically couple one of the plurality of pads of the substrate to one of the plurality of pads of the electronic component using a stud bump. In an example, the one of the plurality of pads of the electronic component comprises a starter, and wherein forming the stud bump is directly coupled to the starter.

In an example, forming the stud bump includes forming a plurality of stud bumps as a stud bump stack, the stud bump stack electrically coupling the one of the plurality of pads of the substrate to the one of the plurality of pads of the electronic component, the plurality of stud bumps coupled end-to-end to extend between the one of the plurality of pads of the substrate to the one of the plurality of pads of the electronic component. In an example, forming the plurality of stud bumps comprises forming each of the plurality of stud bumps with a dome segment and a base segment and coupling a dome segment of a first of the plurality of stud bumps to a base segment of a second of the plurality of stud bumps. In an example, forming the plurality of stud bumps comprises forming the base segment of one of the plurality of stud bumps on the pad of the substrate and the dome of one of the plurality of stud bumps coupled to the pad of the electronic component.

In an example, forming the first of the plurality of stud bumps and the second of the plurality of stud bumps is with a metal. In an example, the metal is copper. In an example, forming the plurality of stud bumps comprises forming the first of the plurality of stud bumps of a first conductive material and the second of the plurality of stud bumps of a second conductive material different than the first conductive material. In an example, the first conductive material is one of gold and silver and the second conductive material is copper.

At 906, a chip is positioned, at least in part, between the major surface of the substrate and the major surface of the electronic component.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic package, comprising:
    a substrate including a plurality of pads on a major surface;
    an electronic component including a plurality of pads on a major surface facing the major surface of the substrate; and
    a stud bump electrically coupling one of the plurality of pads of the substrate to one of the plurality of pads of the electronic component;
    wherein the stud bump is one of a plurality of stud bumps forming a stud bump stack, the plurality of stud bumps coupled end-to-end to extend between the one of the plurality of pads of the substrate to the one of the plurality of pads of the electronic component;
    wherein each of the plurality of stud bumps comprises a dome segment and a base segment, wherein the dome segment and the base segment each have a convex surface and wherein at least one of the stud bumps includes a concave surface between the base segment and the dome segment, and wherein the plurality of stud bumps are coupled end-to-end by coupling the dome segment of a first of the plurality of stud bumps to the base segment of a second of the plurality of stud bumps, wherein the coupling forms a direct and continuous interface between the first and second stud bumps.

2. The electronic package of claim 1, wherein the base segment of one of the plurality of stud bumps is coupled to the pad of the substrate and the dome of one of the plurality of stud bumps is coupled to the pad of the electronic component.

3. The electronic package of claim 1, wherein the first of the plurality of stud bumps and the second of the plurality of stud bumps are comprised of a metal.

4. The electronic package of claim 3, wherein the metal is copper.

5. The electronic package of claim 1, wherein the first of the plurality of stud bumps is comprised of a first conductive material and the second of the plurality of stud bumps is comprised of a second conductive material different than the first conductive material.

6. The electronic package of claim 5, wherein the first conductive material is one of gold and silver and the second conductive material is copper.

7. The electronic package of claim 1, wherein the one of the plurality of pads of the electronic component comprises a starter, and wherein the stud bump is directly coupled to the starter.

8. The electronic package of claim 1, further comprising a chip positioned, at least in part, between the major surface of the substrate and the major surface of the electronic component.

9. The electronic package of claim 1, wherein the base segment of a first one of the plurality of stud bumps is coupled to a corresponding one of the plurality of pads on the substrate.

10. The electronic package of claim 9, wherein the dome segment of a second one of the plurality of stud bumps is coupled to a corresponding one of the plurality of pads of the electronic component.

11. The electronic package of claim 10, wherein the dome segment of the first one of the plurality of stud bumps is flattened in comparison with the dome segment of the second one of the plurality of stud bumps.

12. The electronic package of claim 11, wherein the stud bump stack is a first stud bump stack and further comprising a second stud bump stack having a lateral separation of approximately twenty-eight percent that of the minimum width of the base segment.

* * * * *